(12) United States Patent
Lee (10) Patent No.: US 7,411,459 B2
(45) Date of Patent: Aug. 12, 2008

(54) CURRENT MODE TRANSCONDUCTOR TUNING DEVICE

(75) Inventor: Jeong-won Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 115 days.

(21) Appl. No.: 11/344,075

(22) Filed: Feb. 1, 2006

(65) Prior Publication Data
US 2006/0176106 A1  Aug. 10, 2006

(30) Foreign Application Priority Data
Feb. 4, 2005  (KR) ...................... 10-2005-0010708

(51) Int. Cl.
*H03F 3/04* (2006.01)
(52) U.S. Cl. ...................... 330/305; 327/560
(58) Field of Classification Search .............. 330/305, 330/254, 133
See application file for complete search history.

(56) References Cited
U.S. PATENT DOCUMENTS
5,394,112 A * 2/1995 Alini et al. .................. 330/256
6,933,773 B2 * 8/2005 Mattsson et al. ............ 327/560

FOREIGN PATENT DOCUMENTS
GB  2 393 868 A  4/2004

* cited by examiner

*Primary Examiner*—Robert Pascal
*Assistant Examiner*—Hieu P Nguyen
(74) *Attorney, Agent, or Firm*—Sughrue Mion, PLLC

(57) ABSTRACT

A transconductor tuning device tuning a transconductance using a current. The transconductor tuning device includes a tuning section that applies a tuning current and a reference voltage to a transconductor converting an input voltage signal into a current signal and thereby tunes a level of transconductance. The tuning section includes a tuning current generator that converts a bias signal supplied from a bias current source into a certain level of tuning current and outputs the tuning current to the transconductor. The transconductor includes a control voltage generator that generates a certain level of control voltage using the tuning current. Accordingly, the transconductance of the plurality of transconductors are tuned at the same level.

15 Claims, 7 Drawing Sheets

CURRENT MODE TRANSCONDUCTOR TUNING DEVICE

CROSS-REFERENCE TO RELATED APPLICATIONS

This application claims priority from Korean Patent Application No. 10-2005-0010708, filed on Feb. 4, 2005, the entire content of which is incorporated herein by reference.

BACKGROUND OF THE INVENTION

1. Field of the Invention

The present invention relates to a transconductor tuning device, and more particularly, to a tuning device which tunes a transconductance of a transconductor using a current.

2. Description of the Related Art

A transconductor is a circuit that outputs a current in proportion to a voltage applied to the transconductor as an input signal. The level of output current is calculated by multiplying the input voltage by a transconductance (gm). The transconductor is widely used in an integrated circuit for processing an analog signal, such as operational transconductance amplifier (OTA) and a filter. In order to realize the transconductor, a Metal Oxide Semiconductor (MOS) transistor or a bipolar transistor may be used.

However, the transconductance causes an error due to changes in power supply voltage, temperature and manufacturing process. Therefore, if the transconductor is used in a circuit requiring an accurate transconductance, the transconductor requires a transconductor tuning circuit to maintain a constant transconductance.

Figure 1:
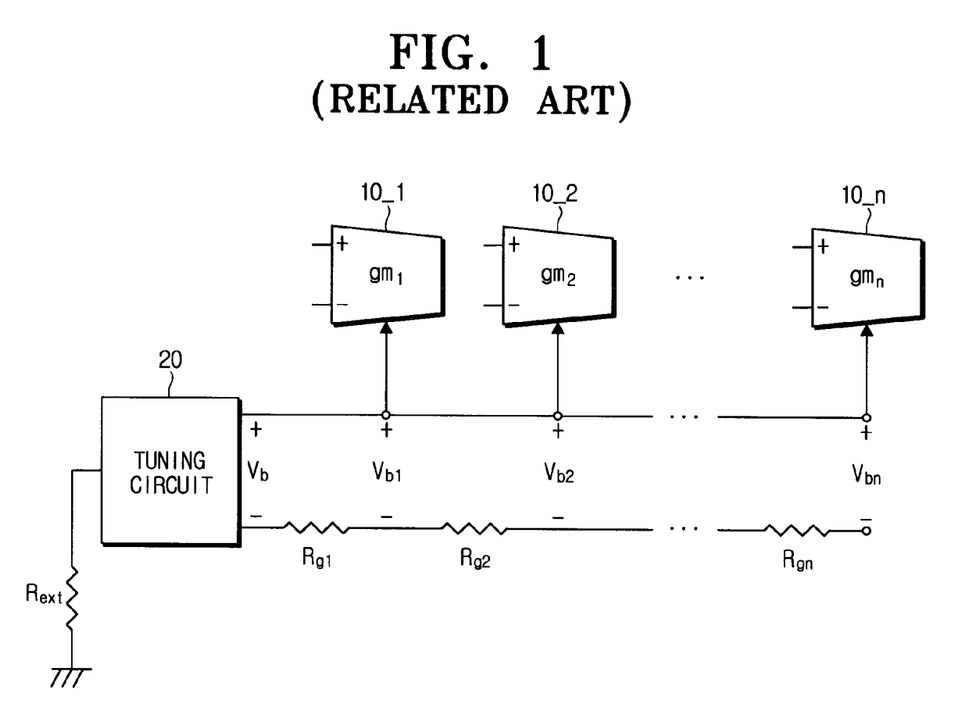
FIG. 1 is a block diagram illustrating a conventional transconductor tuning device.

FIG. 1 is a block diagram illustrating a conventional transconductor tuning device. Referring to FIG. 1, the transconductor tuning device comprises a plurality of transconductors 10_1 to 10_n and a tuning circuit 20. When a current is applied to an external resistor $R_{ext}$ and forms a potential difference, the tuning circuit 20 outputs a certain level of control voltage $V_b$ using the potential difference.

One example of the tuning circuit 20 is disclosed in the publication titled "A 20-MHz sixth-order BiCMOS parasitic insensitive continuous-time filter and second-order equalizer optimized for disc-driver read channels", IEEE J, Solid-State Circuits, vol.28, pp. 462-470, April 1993.

Figure 2:
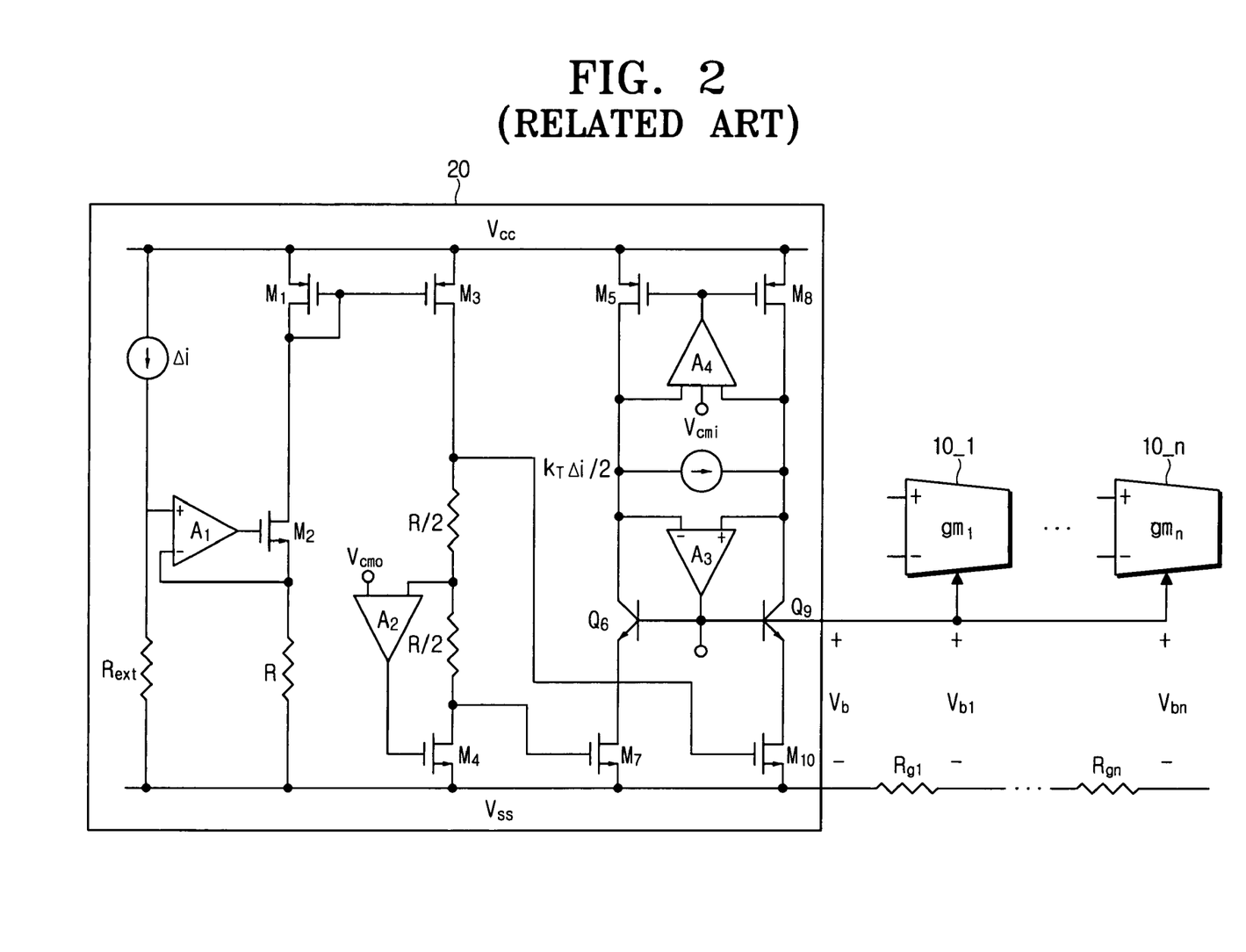
FIG. 2 is a circuit diagram of the conventional transconductor tuning device of FIG. 1.

FIG. 2 illustrates the tuning circuit 20 disclosed in the above publication. Referring to FIG. 2, the tuning circuit 20 controls transconductances of the transconductors 10_1 to 10_n according to the control voltage $V_b$ that is output from an amplifier A3. For this, the tuning circuit 20 comprises a plurality of MOS transistors M1 to M10, a plurality of bipolar transistors Q6 and Q9, and a plurality of amplifiers A1 to A4. The amplifier A4 for generating a common-mode feedback (CMFB) voltage makes source-drain currents output from the MOS transistors M5 and M8 equal. If a current source is connected to drain terminals of the MOS transistor M5 and M8 and applies a current of $k_T\Delta i/2$, the MOS transistors M7 and M10 have a difference of $k_T\Delta i$ in source drain currents.

Two reference voltages generated by the external resistance $R_{ext}$ and a reference current i are applied to gate terminals of the MOS transistors M7 and M10 and generates transconductances corresponding to currents flowing in the respective MOS transistors M7 and M10. There occurs a transconductance difference between the MOS transistors M7 and M10. In order to compensate for the transconductance difference $k_T\Delta i$, the amplifier A3 generates a base voltage $V_b$ of the bipolar transistors Q6 and Q9. If the base voltage $V_b$ is applied to an external transconductor, the transconductor has a constant transconductance due to the $k_T\Delta i$ regardless of changes in characteristics of the MOS transistors.

If there are a plurality of transconductors as shown in FIG. 1, the control voltage $V_b$ output from the tuning circuit 20 is applied to the respective transconductors 10_1 to 10_n. Even if a normal control voltage $V_b$ is output from the tuning circuit 20, different levels of tuning voltages are applied to the respective transconductors 10_1 to 10_n depending on the respective locations of the transconductors 10_1 to 10_n due to the change in a ground reference voltage caused by a ground resistance and a ground current. More specifically, when the control voltage $V_b$ is applied to the first transconductor 10_1, it is changed to a tuning voltage $V_{b1}$ due to a ground resistor $R_{g1}$, and a ground current flowing to the first transconductor 10_1. In the same way, the control voltage $V_b$ is changed to a tuning voltage $V_{b2}$ when being applied to the second transconductor 10_2. As a result, different levels of tuning voltages are applied to the respective transconductors 10_1 to 10_n. To this end, the respective transconductors 10_1 to 10_n have different levels of transconductances $gm_1$, $gm_2$, ..., $gm_n$. Meanwhile, if the transconductors 10_1 to 10_n are realized by MOS, a mismatching is likely to occur among the MOSs as a layout area occupying a chip increases. Accordingly, the transconductance difference becomes greater.

In other word, it is impossible to tune the transconductors 10_1 to 10_n to have an equal transconductance.

Also, since the conventional tuning circuit 20 uses the OP amplifier A3 at an output terminal to generate a transconductance control voltage, there may occur an error due to a DC offset of the OP amplifier A3.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a transconductor tuning device which tunes a plurality of transconductors using a current and thus is not subjected to an effect caused by the change in a ground resistance, a distance between the transconductors, and a DC offset of an OP amplifier, thereby accurately tuning the transconductance.

According to an aspect of the present invention, there is provided a transconductor tuning device including at least one transconductor that has a predetermined transconductance, and a tuning section that applies a certain level of tuning current and a certain level of reference voltage to the at least one transconductor to tune a value of the transconductance.

Preferably, but not necessarily, the tuning section includes a reference voltage generator that is connected to an external resistor, generates the reference voltage corresponding to a voltage generated by a constant current flowing into the external resistor and outputs the reference voltage to the at least one transconductor, and a tuning current generator that generates the tuning current and outputs the tuning current to the at least one transconductor.

Preferably, but not necessarily, the tuning current generator includes at least one current mirror circuit.

Preferably, but not necessarily, the current mirror circuit includes a first MOS transistor that connects a source terminal thereof to a predetermined bias power source and has a gate terminal and a drain terminal connected to each other to have a diode-like configuration, a second MOS transistor that connects a source terminal thereof to the drain terminal of the first MOS transistor and has a gate terminal and a drain terminal connected to each other to have a diode-like configuration, and at least one MOS transistor terminal that includes a pair of MOS transistors connecting their own gate terminals to the gate terminals of the first and the second MOS transistors, the at least one MOS transistor terminal mirroring currents flowing in the first and the second MOS transistors and outputting the mirrored currents to the at least one transconductor.

Preferably, but not necessarily, the tuning current generator further includes a first bipolar transistor that connects a collector terminal thereof to the drain terminal of the second MOS transistor, a second bipolar transistor that connects a base terminal thereof to a base terminal of the first bipolar transistor, a third MOS transistor that connects a source terminal thereof to the base terminals of the first and the second bipolar transistors and connects a gate terminal of the third MOS transistor to a collector terminal of the second bipolar transistor, and a current source that connects the gate terminal of the second MOS transistor to a predetermined ground terminal and thereby supplies a certain level of control current.

Preferably, but not necessarily, if the constant current flowing into the external resistor is Δi and if a current control coefficient is $k_T$, a current of $k_T\Delta i$ is supplied. Accordingly, the transconductance of the at least one transconductor is tuned to have a certain level.

Preferably, but not necessarily, the transconductor includes a control voltage generator that generates a certain level of control voltage using the tuning current, and a converter that, if a certain level of input voltage is applied, outputs a level of current that is calculated by multiplying a certain level of transconductance corresponding to the control voltage by the input voltage.

Preferably, but not necessarily, the control voltage generator includes a third bipolar transistor that, if the tuning current is applied to the collector terminal, outputs a certain level of control voltage corresponding to the level of tuning current through a base terminal, and a fourth MOS transistor that connects a drain terminal thereof to an emitter terminal of the bipolar transistor, the reference voltage generated by the reference voltage generator being applied to a gate terminal of the fourth MOS transistor.

Preferably, but not necessarily, the transconductor tuning device further includes a fifth MOS transistor that connects a gate terminal and a source terminal thereof to a collector terminal and the base terminal of the third bipolar transistor, respectively, and thereby compensates an error of the control voltage output from the third bipolar transistor.

Preferably, but not necessarily, the tuning current generator further includes a third MOS transistor that connects a drain terminal thereof to the drain terminal of the second MOS transistor, a fourth MOS transistor that connects a gate terminal thereof to the gate terminal of the third MOS transistor, and a current source that connects the gate terminal of the second MOS transistor to a predetermined ground terminal and supplies a certain level of control current.

Preferably, but not necessarily, if a current applied to the external resistor is Δi, the current source supplies a current i calculated by the following equation: $i=k_T\Delta i$ In this case, the transconductance of the at least one transconductor is tuned according to the current control coefficient $k_T$.

Preferably, but not necessarily, the transconductor includes a control voltage generator that generates a certain level of control voltage using the tuning current, and a converter that, if a certain level of input voltage is applied, outputs a level of current which is calculated by multiplying a certain level of transconductance corresponding to the control voltage by the input voltage.

Preferably, but not necessarily, the control voltage generator includes a fifth MOS transistor that, if the tuning current is applied to a drain terminal, outputs a certain level of control voltage corresponding to the tuning current through a gate terminal, and a sixth MOS transistor that connects a drain terminal thereof to the gate terminal of the fifth MOS transistor, the reference voltage generated by the reference voltage generator being applied to a gate terminal of the sixth transistor.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

The present invention will now be described with reference to the accompanying drawings in which exemplary embodiments of the present invention are shown. However, the present invention should not be construed as limited to the exemplary embodiments set forth herein. Rather, these exemplary embodiments are provided so that this disclosure will be thorough and complete, and will fully convey the scope of the invention to those skilled in the art. In the following description, same drawing reference numerals are used for the same elements even in different drawings.

Figure 3:
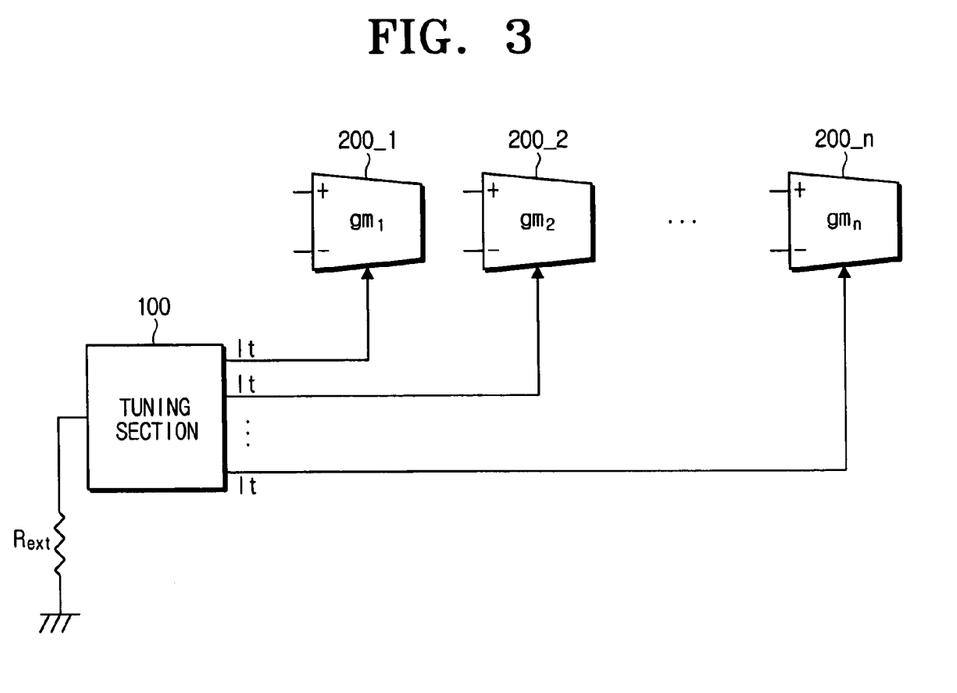
FIG. 3 is a block diagram illustrating a transconductor tuning device according to an exemplary embodiment of the present invention.

FIG. 3 is a block diagram illustrating a transconductor tuning device according to an exemplary embodiment of the present invention. Referring to FIG. 3, the transconductor tuning device comprises a tuning section 100 and at least one transconductors 200_1 to 200_n.

The tuning section 100 is connected with an external resistor $R_{ext}$. The tuning section 100 generates a certain level of tuning current $I_t$ using a voltage generated by a predetermined constant current flowing into the external resistor $R_{ext}$, and applies the tuning current $I_t$ to the transconductors 200_1 to 200_n. The constant current flowing into the external resistor $R_{ext}$ may be a band gap reference current for the use by the tuning section 100. Each transconductor 200_1 to 200_n converts the tuning current $I_t$ into a certain level of control voltage. As a result, a transconductance is tuned according to the control voltage.

Figure 4:
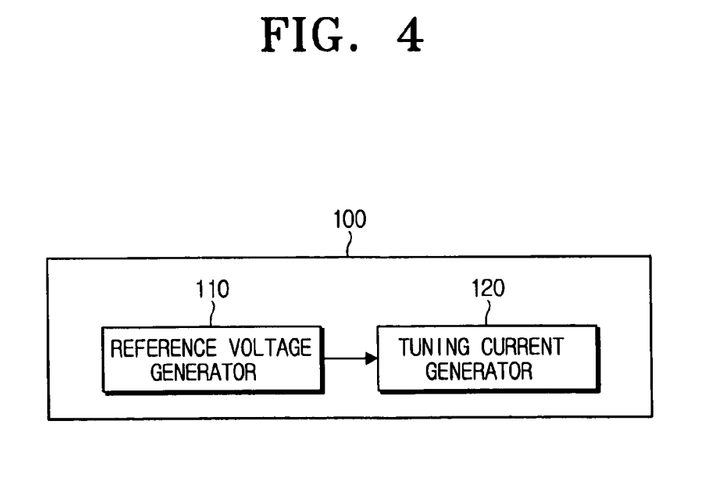
FIG. 4 is a block diagram illustrating a tuning section of the transconductor tuning device according to an exemplary embodiment of the present invention.

FIG. 4 is a block diagram illustrating the tuning section 100 according to an exemplary embodiment of the present invention. Referring to FIG. 4, the tuning section 100 comprises a reference voltage generator 110 and a tuning current generator 120.

The reference voltage generator 110 generates a certain level of reference voltage using the external resistor $R_{ext}$ and an inner reference current $\Delta i$. The reference voltage generator 110 is realized in a circuit that is substantially similar to the tuning circuit 20 of FIG. 2.

The tuning current generator 120 converts the reference voltage generated by the reference voltage generator 110 and a control current $k_T \Delta i$ into the tuning current $I_t$, and outputs the tuning current $I_t$ to the respective transconductor 200_1 to 200_n. In order to provide the same level of tuning current $I_t$ to the respective transconductor 200_1 to 200_n, the tuning current generator 120 uses a current mirror circuit. The current mirror circuit is realized by a combination of bipolar transistors and/or MOS transistors.

Figure 5:
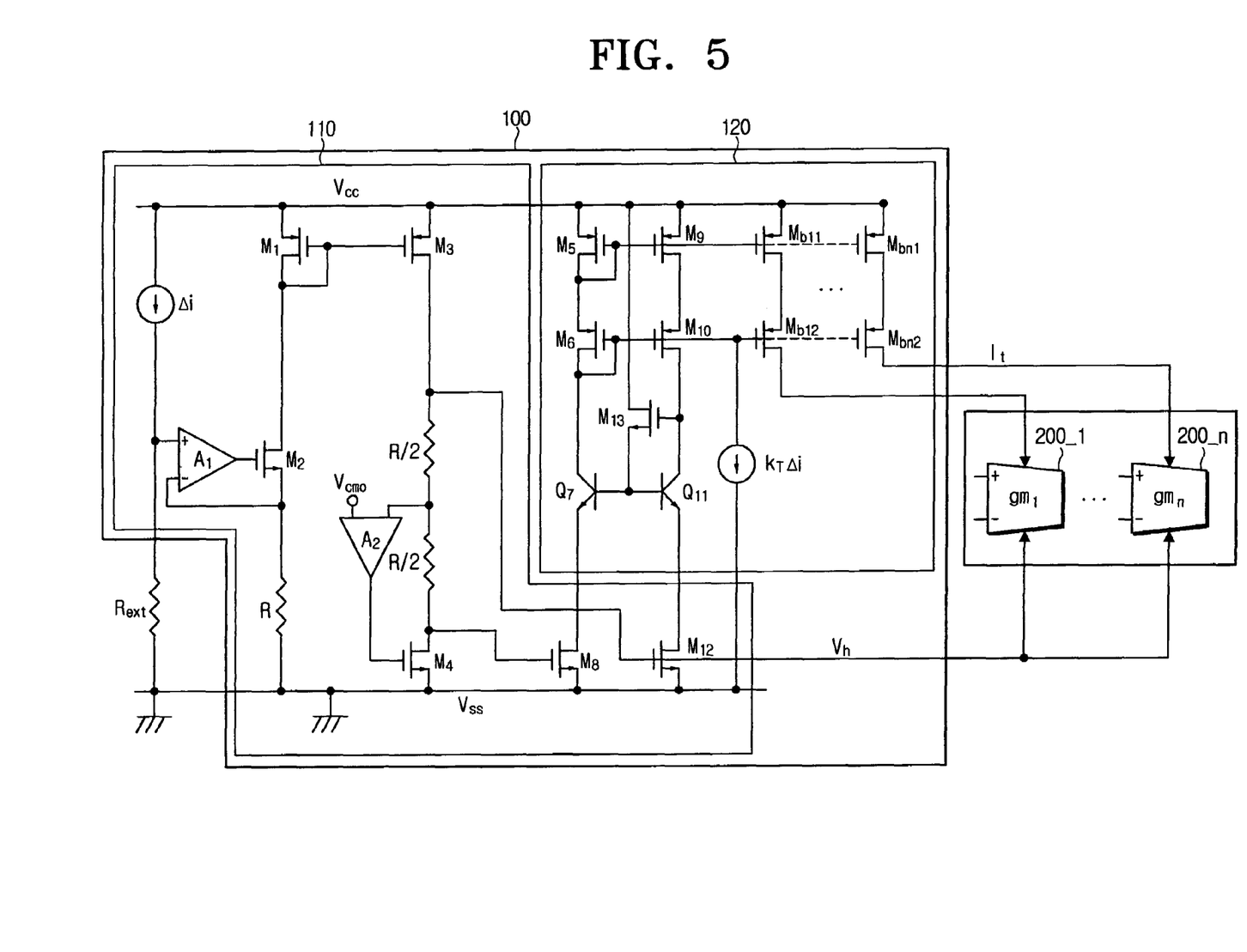
FIG. 5 is a circuit diagram illustrating one example of the tuning section of the transconductor tuning device according to an exemplary embodiment of the present invention.

FIG. 5 is a circuit diagram of the tuning section 100 according to an exemplary embodiment of the present invention. Referring to FIG. 5, the reference voltage generator 110 of the tuning section 100 comprises amplifiers A1 and A2, a current source, and a plurality of MOS transistors M1, M2, M3, M4, M8 and M12.

The voltage generated by applying the inner reference voltage $\Delta i$ to the external resistor $R_{ext}$ is converted into a current by an inner resistor R and the A1. The MOS transistors M1 and M3 mirror the converted current and thereby output the current to resistors R/2. A drain voltage of the MOS transistor M3 is divided into certain level of voltages by the two resistors R/2 and the voltages are applied to an input terminal of the amplifier A2. As a result, the amplifier A2 generates certain levels of upper and lower voltages with reference to a common mode voltage $V_{cmo}$. The generated upper and lower voltages are applied to gate terminals of the MOS transistors M8 and M12. The upper voltage applied to the gate terminal of the MOS transistor M12 is set to a reference voltage $V_h$.

The tuning current generator 120 comprises a current mirror circuit composed of a plurality of MOS transistors, bipolar transistors Q7 and Q11 connecting to each other in a symmetrical pattern, and a current source. The current mirror circuit can be realized in various formations. As shown in FIG. 5, the current mirror circuit is realized by a cascode mirror circuit. That is, the current mirror circuit comprises the MOS transistor M5 connecting its source terminal to a bias power supply, a MOS transistor M6 connecting its source terminal to a drain terminal of the MOS transistor M5, a MOS transistor M9 connecting its gate terminal to a gate terminal of the MOS transistor M5, and a MOS transistor M10 connecting its gate terminal to a gate terminal of the MOS transistor M6. The MOS transistors M5 and M6 connect their respective gate terminals to their respective drain terminals to have a diode-like configuration. The MOS transistors M9 and M10 form a single MOS transistor terminal in which the drain terminal of the MOS transistor M9 connects to the source terminal of the MOS transistor M10. In the same manner, each pair of MOS transistors Mb11, Mb12, ..., and the MOS transistors Mbn1, Mbn2 forms a single MOS transistor terminal. The MOS transistor terminals output the same level of current.

The current output from the MOS transistor terminal formed by the MOS transistors M9 and M10, i.e., the tuning current $I_t$ is input into a collector terminal of the bipolar transistor Q11. A predetermined current source is connected between a node connecting the gate terminal of the MOS transistor M10 along with the gate terminal of the MOS transistor M6 and a ground. The current source supplies a current of $k_T \Delta i$. The gate terminal and the drain terminal of the MOS transistor M6 are connected to each other to have a diode-like configuration. Accordingly, the currents applied to the bipolar transistors Q7 and Q11 connected to the respective drain terminals of the MOS transistors M6 and M10 have a difference of $k_T \Delta i$.

The bipolar transistor Q7 is biased by the bipolar transistor Q11 having a diode-like configuration, and the MOS transistors M8 and M12 have the same level of drain-source voltage because they are connected to the bases of the bipolar transistors Q7 and Q11. The MOS transistor M13 functions to compensate for an error that is caused by a current flowing into the bases of the bipolar transistors Q7 and Q11.

A difference between the upper and the lower voltages applied to the MOS transistors M8 and M12 is a differential input voltage $\Delta v$. Accordingly, a transconductance generated by the bipolar transistors Q7 and Q11 and the MOS transistors M8 and M12 are calculated by the following Equation 1.

$$g_m = \frac{k_T \Delta_i}{\Delta v} = \frac{k_T}{R_{ext}} \qquad \text{[Equation 1]}$$

In Equation 1, $k_T$ denotes a current control coefficient. Accordingly, the transconductance is tuned according to the current control coefficient $k_T$.

The tuning current $I_t$ flowing into the bipolar transistor Q11 is applied to the respective transconductors 200_1 to 200_n by the above-described current mirror circuit. Also, the reference voltage $V_h$ generated by the reference voltage generator 110 is applied to the respective transconductors 200_1 to 200_n. Herein, the reference voltage $V_h$ is set to a greater value than the control voltage output from the conventional circuit. For example, if a bias voltage is 5 V, the reference voltage $V_h$ is set to approximately 3 V. Accordingly, the transconductances of the transconductors 200_1 to 200_n are tuned according to the current control coefficient $k_T$.

The tuning current generator 120 of the tuning section 100 generates a control current without requiring an amplifier. Therefore, the tuning section 100 is not subjected to an effect caused by a DC offset of an amplifier and thus tuning can be normally performed.

Figure 6:
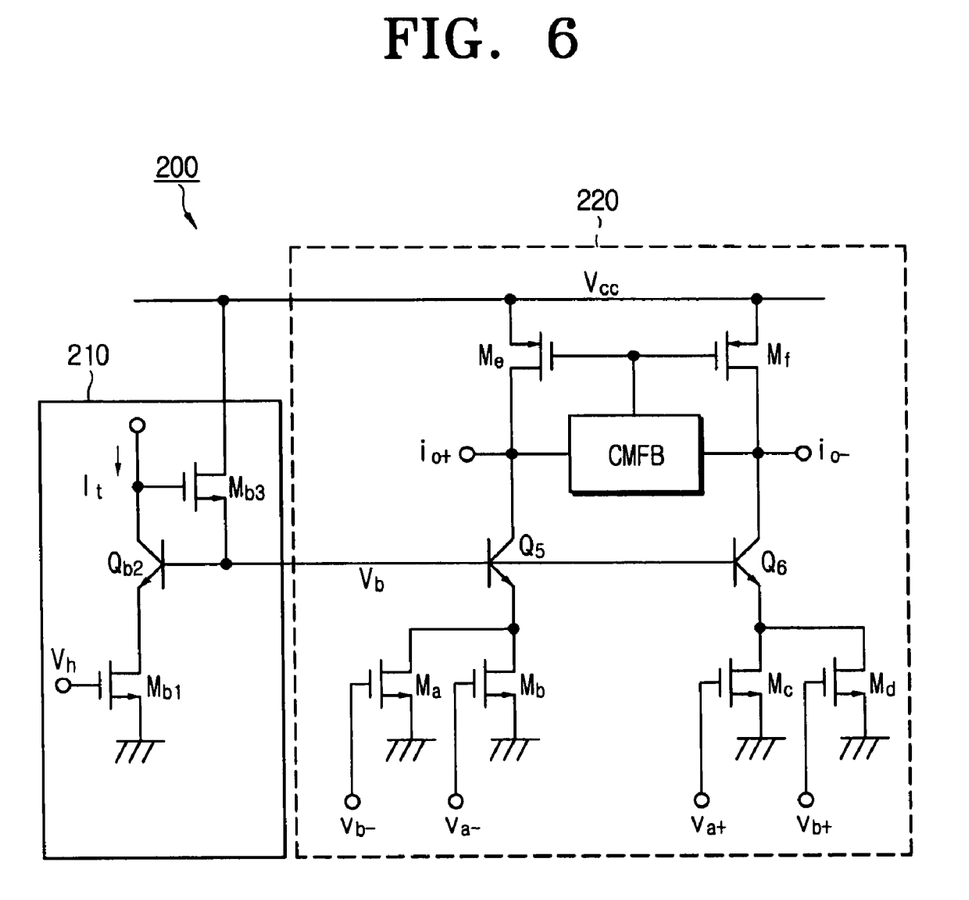
FIG. 6 is a circuit diagram illustrating a transconductor corresponding to the tuning section of FIG. 5.

FIG. 6 is a circuit diagram illustrating one transconductor 200 of the plurality of transconductors 200_1 to 200_n. Referring to FIG. 6, the transconductor 200 comprises a control voltage generator 210 and a converter 220.

The control voltage generator 210 generates a certain level of control voltage using the reference voltage $V_h$ and the tuning current $I_t$ applied from the tuning section 100. Referring to FIG. 6, the control voltage generator 210 comprises MOS transistors Mb1, Mb3 and a bipolar transistor Qb2.

The tuning current $I_t$ is applied to a collector terminal of the bipolar transistor Qb2 and the reference voltage $V_h$ is applied to a gate terminal of the MOS transistor Mb1. The bipolar transistor Qb2 and the MOS transistor Mb2 correspond to the bipolar transistor Q11 and the MOS transistor M12 of the tuning section 100, respectively. The MOS transistor Mb3 corresponds to the MOS transistor M13 of the tuning section 100. That is, a gate terminal and a source terminal of the MOS transistor Mb3 are connected to the collector terminal and a base terminal of the bipolar transistor Qb2, respectively.

Accordingly, the MOS transistor Mb3 compensates for an error of the control voltage output from the bipolar transistor Qb2. As a result, the control voltage generator 210 generates the same level of transconductance using the tuning current $I_t$ and the reference voltage $V_h$ as that generated by the bipolar transistor Q11 and the MOS transistor M12. That is, a base voltage generated by the tuning current $I_t$ and the reference voltage $V_h$ and output from the bipolar transistor Qb2 is converted into a control voltage $V_b$ and applied to the converter 220.

The converter 220 comprises a plurality of MOS transistors, bipolar transistors and a Common-Mode Feedback (CMFB) circuit. The control voltage $V_b$ generated by the control voltage generator 210 is applied to base terminals of the bipolar transistors Q5 and Q6. Accordingly, the control voltage $V_b$ is voltage-dropped down to a voltage Vb-Vbe by a base-emitter voltage Vbe of the bipolar transistors Q5 and Q6 and the voltage Vb-Vbe is applied to drain terminals of the MOS transistors Ma to Md. The transconductances are generated in proportion to the voltage Vb-Vbe. As a result, the converter 220 outputs a current that corresponds to a value obtained by multiplying an input voltage applied to the MOS transistors Ma to Md by a transconductance through the collector terminals of the bipolar transistors Q5 and Q6.

The transconductor circuit according to the present invention comprises the MOS transistors Me and Mf and the bipolar transistors Q5 and Q6. The MOS transistors Me and Mf are biased under the control of a common-mode feedback (CMFB) circuit. The CMFB circuit extracts a common mode from the control voltage Vb and applies a difference between the common mode component and a predetermined threshold to gate terminals of the MOS transistors Me and Mf. Accordingly, the differential input/output structure such as those of the MOS transistors Me and Mf and the bipolar transistors Q5 and Q6 has a constant output value.

The conventional tuning circuit directly applies a control voltage to the respective transconductors to tune the transconductances. In order to tune the transconductance to be at a low level, the control voltage has to be set at a slightly greater value than the base-emitter voltage of the bipolar transistors Q5 and Q6. Therefore, a slight change in the control voltage due to a ground resistance would likely result in a failure to tune the transconductance. However, according to the present invention, the control current and the reference voltage are applied to the respective transconductors 100_1 to 100_n. Since the reference voltage has a high value of approximately 3V if the bias voltage is 5V, the reference voltage is not subjected to the effect of the ground resistor. Also, since the tuning current is not subjected to the ground resistance, the tuning operation is normally performed.

Figure 7:
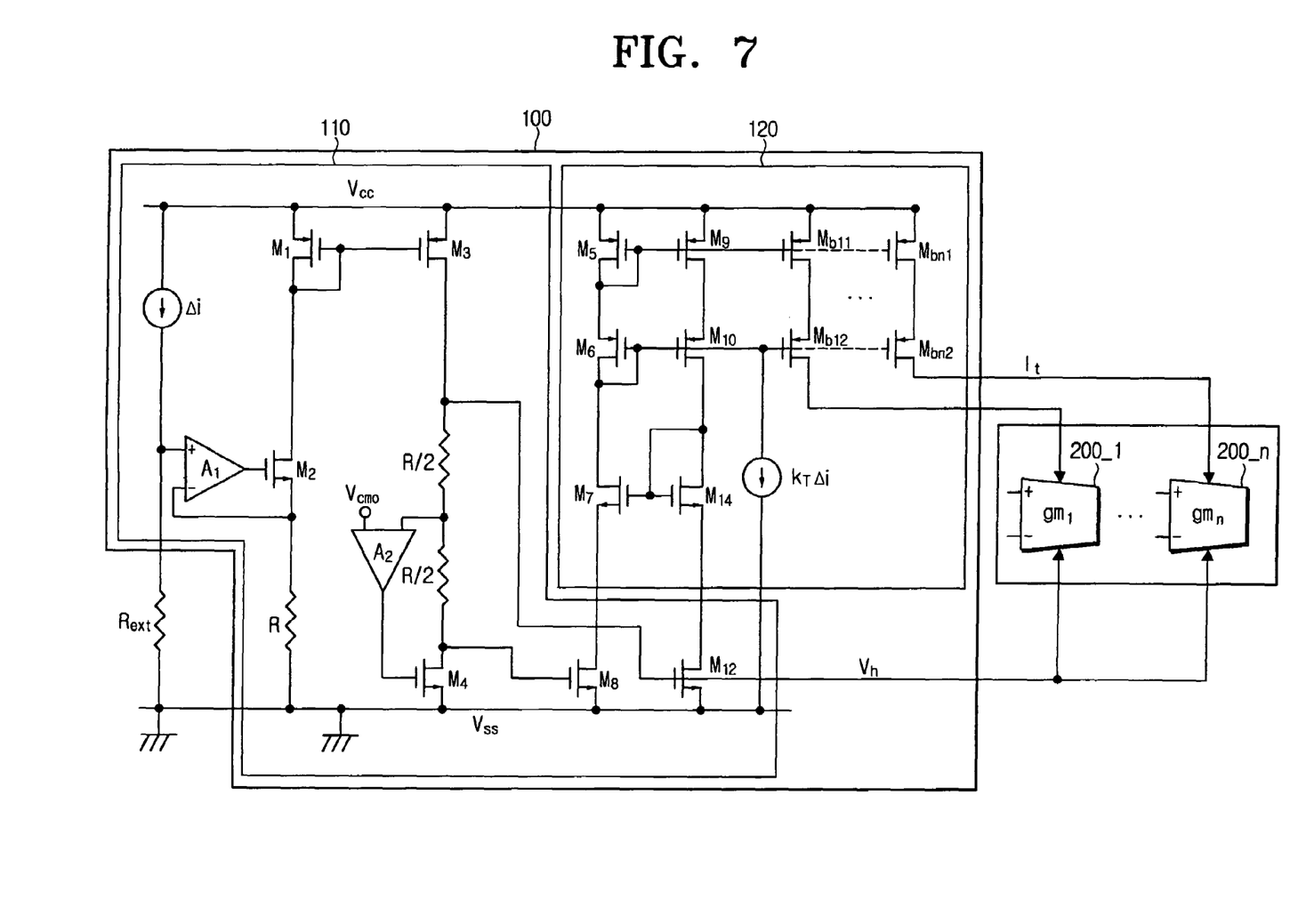
FIG. 7 is a circuit diagram illustrating another example of the tuning section of the transconductor tuning device according to an exemplary embodiment of the present invention.

FIG. 7 is a circuit diagram illustrating another example of the tuning section 100 of the transconductor tuning device according to an exemplary embodiment of the present invention. Unlike in FIG. 5, a tuning current generator 120 uses MOS transistors M7 and M14 instead of the two bipolar transistors Q7 and Q11. Accordingly, the MOS transistor M13 added in order to compensate for the error caused by the current flowing into the base of the bipolar transistors Q7 and Q11 is not required. Since the operation of the circuit of FIG. 7 is the same as of FIG. 5, a description thereof is omitted.

Figure 8:
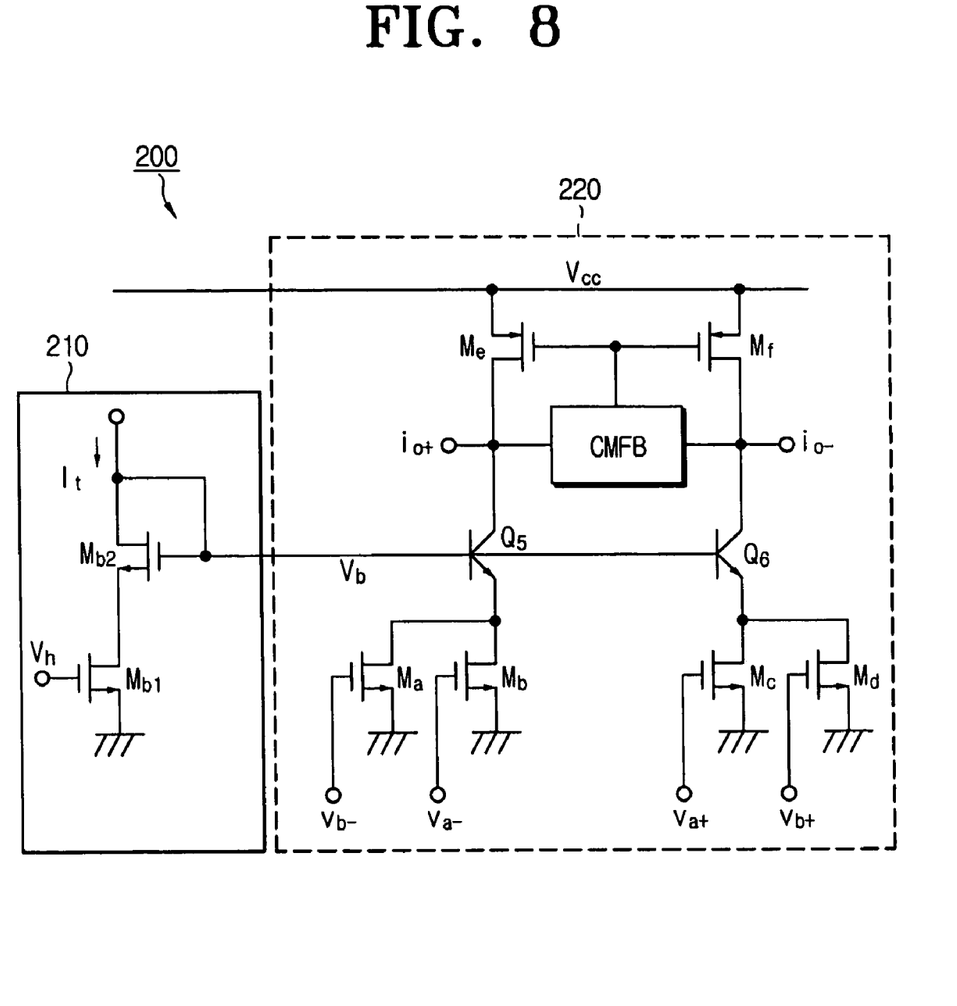
FIG. 8 is a circuit diagram illustrating a transconductor corresponding to the tuning section of FIG. 7.

FIG. 8 illustrates a transconductor corresponding to the tuning section 100 of FIG. 7. Unlike in FIG. 6, a control voltage generator 210 uses a MOS transistor MB2 instead of the bipolar transistors Qb2. Accordingly, the MOS transistor Mb5 of FIG. 5 is not required. Since the operation of the circuit of FIG. 8 is the same as of FIG. 6, a description thereof is omitted.

According to the present invention as described above, a current is used as a signal for controlling the transconductances of the transconductor. Accordingly, the transconductance is not affected by changes in the ground resistance. Since a control current is generated without requiring an operational amplifier, the transconductance is not affected by an offset of the operational amplifier. As a result, the transconductances of the plurality of transconductors are tuned at the same level.

The foregoing embodiments and advantages are merely exemplary in nature and are not to be construed as limiting the present invention. The present teaching can be readily applied to other types of apparatuses. Also, the description of the exemplary embodiments of the present invention is intended to be illustrative, and therefore it does not limit the scope of the claims. Alternatives, modifications, and variations of the exemplary embodiments described herein will be readily apparent to those skilled in the art.

What is claimed is:

1. A transconductor tuning device comprising:
   a first and a second transconductor that have a transconductance; and
   a tuning section that applies a tuning current and a reference voltage to the first and second transconductors to tune a value of the transconductance, wherein the tuning section comprises:
   a reference voltage generator that is connected to an external resistor, generates the reference voltage corresponding to a voltage generated by a constant current flowing into the external resistor and outputs the same reference voltage to both the first and second transconductors; and
   a tuning current generator that generates the tuning current and outputs the same tuning current to both the first and second transconductor.

2. The transconductor tuning device as claimed in claim 1, wherein the tuning current generator includes at least one current mirror circuit.

3. The transconductor tuning device as claimed in claim 1, wherein the reference voltage generator includes a current mirror circuit.

4. A transconductor tuning device comprising:
   at least one transconductor that has a transconductance; and
   a tuning section that applies a tuning current and a reference voltage to the at least one transconductor to tune a value of the transconductance, wherein the tuning section comprises:
   a reference voltage generator that is connected to an external resistor, generates the reference voltage corresponding to a voltage generated by a constant current flowing into the external resistor and outputs the reference voltage to the at least one transconductor; and
   a tuning current generator that generates the tuning current and outputs the tuning current to the at least one transconductor, wherein the current mirror circuit comprises:
   a first Metal Oxide Semiconductor (MOS) transistor having a source terminal connected to a predetermined bias power source, and a gate terminal and a drain terminal connected to each other;
   a second MOS transistor having a source terminal connected to the drain terminal of the first MOS transistor, and a gate terminal and a drain terminal connected to each other; and
   at least one MOS transistor terminal that includes a pair of MOS transistors having gate terminals connected to the gate terminals of the first and the second MOS transistors, the at least one MOS transistor terminal mirroring currents flowing in the first and the second MOS transistors and outputting the mirrored currents to the at least one transconductor.

5. The transconductor tuning device as claimed in claim 4, wherein the tuning current generator further comprises:
   a first bipolar transistor having a collector terminal connected to the drain terminal of the second MOS transistor;
   a second bipolar transistor having a base terminal connected to a base terminal of the first bipolar transistor;
   a third MOS transistor having a source terminal connected to the base terminals of the first and the second bipolar transistors, and a gate terminal connected to a collector terminal of the second bipolar transistor; and
   a current source that is connected between the gate terminal of the second MOS transistor and a ground terminal, and supplies a control current.

6. The transconductor tuning device as claimed in claim 5, wherein, if the constant current flowing into the external resistor is $\Delta i$, the current source supplies a current i calculated by the following equation:

$$i = k_T \Delta i$$

wherein the $k_T$ denotes a current control coefficient.

7. The transconductor tuning device as claimed in claim 6, wherein the transconductance of the at least one transconductor is tuned based on to the following equation:

$$g_M = \frac{k_T}{R_{ext}}$$

wherein $g_M$ denotes a transconductance, $k_T$ denotes the current control coefficient and $R_{ext}$ denotes an external resistance of the external resistor.

8. The transconductor tuning device as claimed in claim 5, wherein the transconductor comprises:
   a control voltage generator that generates a control voltage using the tuning current; and
   a converter that, if a certain level of input voltage is applied, outputs a level of current that is calculated by multiplying a level of transconductance corresponding to the control voltage with the input voltage.

9. The transconductor tuning device as claimed in claim 8, wherein the control voltage generator comprises:
   a third bipolar transistor that, if the tuning current is applied to the collector terminal, outputs a level of the control voltage corresponding to a level of the tuning current through a base terminal; and
   a fourth MOS transistor having a drain terminal connected to an emitter terminal of the bipolar transistor, the reference voltage generated by the reference voltage generator being applied to a gate terminal of the fourth MOS transistor.

10. The transconductor tuning device as claimed in claim 9, further comprising a fifth MOS transistor having a gate terminal and a source terminal connected to a collector terminal and the base terminal of the third bipolar transistor, respectively, and thereby compensates an error of the control voltage output from the third bipolar transistor.

11. The transconductor tuning device as claimed in claim 4, wherein the tuning current generator further comprises:
   a third MOS transistor having a drain terminal connected to the drain terminal of the second MOS transistor;
   a fourth MOS transistor having a gate terminal connected to the gate terminal of the third MOS transistor; and
   a current source that is connected between the gate terminal of the second MOS transistor and a predetermined ground terminal, and supplies a control current.

12. The transconductor tuning device as claimed in claim 11, wherein, if a current applied to the external resistor is $\Delta i$, the current source supplies a current i calculated by the following equation:

$$i = k_T \Delta i$$

wherein $k_T$ denotes a current control coefficient.

13. The transconductor tuning device as claimed in claim 12, wherein the transconductance of the at least one transconductor is tuned based on the following equation:

$$g_M = \frac{k_T}{R_{ext}}$$

wherein $g_M$ denotes a transconductance, $k_T$ denotes the current control coefficient and Rext denotes an external resistance of the external resistor.

14. The transconductor tuning device as claimed in claim 11, wherein the transconductor comprises:
   a control voltage generator that generates a control voltage using the tuning current; and
   a converter that, if a certain level of input voltage is applied, outputs a level of current which is calculated by multiplying a level of transconductance corresponding to the control voltage with the input voltage.

15. The transconductor tuning device as claimed in claim 14, wherein the control voltage generator comprises:
   a fifth MOS transistor that, if the tuning current is applied to a drain terminal, outputs a level of the control voltage corresponding to a level of the tuning current through a gate terminal; and
   a sixth MOS transistor having a drain terminal connected to the gate terminal of the fifth MOS transistor, the reference voltage generated by the reference voltage generator being applied to a gate terminal of the sixth transistor.

* * * * *